United States Patent
Jo et al.

(10) Patent No.: US 10,491,728 B2
(45) Date of Patent: Nov. 26, 2019

(54) KEY MODULE AND MOBILE TERMINAL HAVING SAME, AND METHOD OF ASSEMBLING KEY MODULE

(71) Applicant: LG ELECTRONICS INC., Seoul (KR)

(72) Inventors: Ikhyun Jo, Seoul (KR); Sehoon Chun, Seoul (KR); Jangwoo Hong, Seoul (KR); Chalkee Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/995,581

(22) Filed: Jun. 1, 2018

(65) Prior Publication Data

US 2019/0289108 A1    Sep. 19, 2019

(30) Foreign Application Priority Data

Mar. 19, 2018    (KR) .................. 10-2018-0031419

(51) Int. Cl.
| | |
|---|---|
| *H04M 1/18* | (2006.01) |
| *H04M 1/02* | (2006.01) |
| *H01K 13/06* | (2006.01) |
| *H05K 5/06* | (2006.01) |

(52) U.S. Cl.
CPC .............. *H04M 1/18* (2013.01); *H01K 13/06* (2013.01); *H04M 1/0254* (2013.01); *H05K 5/069* (2013.01)

(58) Field of Classification Search
CPC .............................. H04M 1/18; H04M 1/0254
See application file for complete search history.

(56) References Cited

U.S. PATENT DOCUMENTS

| | | | |
|---|---|---|---|
| 9,360,894 B1* | 6/2016 | Lin ....................... | G06F 1/1656 |
| 2012/0051015 A1* | 3/2012 | Dabov .................. | G06F 1/1656 |
| | | | 361/760 |
| 2013/0016053 A1* | 1/2013 | Jung ..................... | G06F 3/016 |
| | | | 345/173 |
| 2013/0079069 A1* | 3/2013 | Kwon .................... | H01Q 1/243 |
| | | | 455/575.5 |
| 2016/0086745 A1* | 3/2016 | Seo ........................ | H01R 24/60 |
| | | | 200/51 R |
| 2017/0118319 A1* | 4/2017 | Jun ...................... | H04B 1/3827 |
| 2017/0154741 A1* | 6/2017 | Chen ..................... | H01H 13/06 |

* cited by examiner

*Primary Examiner* — Christopher M Brandt
(74) *Attorney, Agent, or Firm* — Birch, Stewart, Kolasch & Birch, LLP

(57) ABSTRACT

A key module for a mobile terminal, and which includes a key having a neck part and a head key pressed to enter an input to the mobile terminal; a circuit support configured to support a circuit board having a dome terminal to be pressed when the key head is pressed for entering the input to the terminal; and a waterproof member positioned between the key and the circuit support and configured to block a moisture penetration path along a hole in a case member of the mobile terminal into which the key module is inserted.

18 Claims, 16 Drawing Sheets

KEY MODULE AND MOBILE TERMINAL HAVING SAME, AND METHOD OF ASSEMBLING KEY MODULE

CROSS-REFERENCE TO RELATED APPLICATION

Pursuant to 35 U.S.C. § 119(a), this application claims the benefit of earlier filing date and right of priority to Korean Patent Application No. 10-2018-0031419, filed on Mar. 19, 2018, the contents of which are incorporated by reference herein in their entirety.

BACKGROUND OF THE INVENTION

Field of the Invention

The present invention relates to a common key module in which a mobile terminal of a waterproof model and a mobile terminal of a non-waterproof model are compatible with each other. Furthermore, the present invention relates to a mobile terminal having a key module and a key module assembly method of assembling a key module and a mobile terminal.

Discussion of the Related Art

A terminal may be divided into a mobile/portable terminal and a stationary terminal depending on whether the terminal can be moved. The mobile terminal may be divided into a handheld (type) terminal and a vehicle-mounted terminal depending on whether the mobile terminal can be directly carried by a user.

The function of the mobile terminal is diversified. For example, the functions include the functions of data and voice communication, photographing and video photographing through a camera, voice recording, the playback of a music file through a speaker system, and the output of an image or video to a display unit. Some terminals have an electronic game play function or perform a multimedia player function. More specifically, a recent mobile terminal may receive a multicast signal that provides visual content, such as broadcasting, video or a television program.

As the function of such a terminal is diversified, the terminal is implemented in a multimedia player form having complex functions, such as the photographing of a photo or a moving image, the playback of music or a moving image file, gaming, and the reception of broadcasting. In order to support and enhance such functions of the terminal, to improve a structural portion and/or software portion of the terminal may be taken into consideration.

A mobile terminal having a waterproof function is released. More specifically, a configuration for a waterproof function with respect to a hole formed in a mobile terminal may be applied to the mobile terminal. For example, moisture may be introduced through a hole through which a side key positioned on the side of a mobile terminal is exposed. A waterproof design is applied to the side key assembled with a mobile terminal of a waterproof model.

SUMMARY OF THE INVENTION

A key module having a waterproof function is designed to be dedicated to a waterproof model and is not compatible with a mobile terminal of a non-waterproof model. The key module having the waterproof function includes a large number of parts and has a complicated structure. Furthermore, a moisture inflow path may be positioned between the key module and the case member of the mobile terminal.

Accordingly, an embodiment of the present invention is to provide a key module implemented to have a simple structure and applicable to mobile terminals of a waterproof model and a non-waterproof model in common. Another embodiment of the present invention is to provide a mobile terminal having a key module and a key module assembly method of assembling a key module and a mobile terminal.

A key module according to an embodiment of the present invention includes a key implemented as one piece of the same material, wherein an external force is applied to the key, a circuit support configured to support a circuit board having a dome terminal, and a waterproof member positioned between the key and the circuit support and configured to deliver pressure of the key to the dome terminal.

A mobile terminal according to an embodiment of the present invention includes a terminal body from which a display unit is exposed, an internal space being provided in the terminal body. A key module is partially exposed through holes penetrating the sidewall of the terminal body.

A method of assembling a key module according to an embodiment of the present invention includes assembling a key module into the internal space of a terminal body through holes penetrating the sidewall of the terminal body. The key of the key module exposed to the outside of the terminal body is inserted into the holes in the assembly direction from the internal space of the terminal body toward the outside of the terminal body.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF THE EMBODIMENTS

Description will now be given in detail according to exemplary embodiments disclosed herein, with reference to the accompanying drawings. For the sake of brief description with reference to the drawings, the same or equivalent components can be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

Although the terms first, second, etc. may be used herein to describe various elements, these elements should not be limited by these terms. These terms are generally only used to distinguish one element from another.

When an element is referred to as being "connected with" another element, the element may be connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "have" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, and wearable devices (e.g., smart watches, smart glasses, and head mounted displays (HMDs)).

By way of a non-limiting example only, further description will be made with reference to particular types of mobile terminals. However, such teachings apply equally to other types of terminals, such as those types noted above. In addition, these teachings may also be applied to stationary terminals, such as digital TV, and desktop computers.

Figure 1:
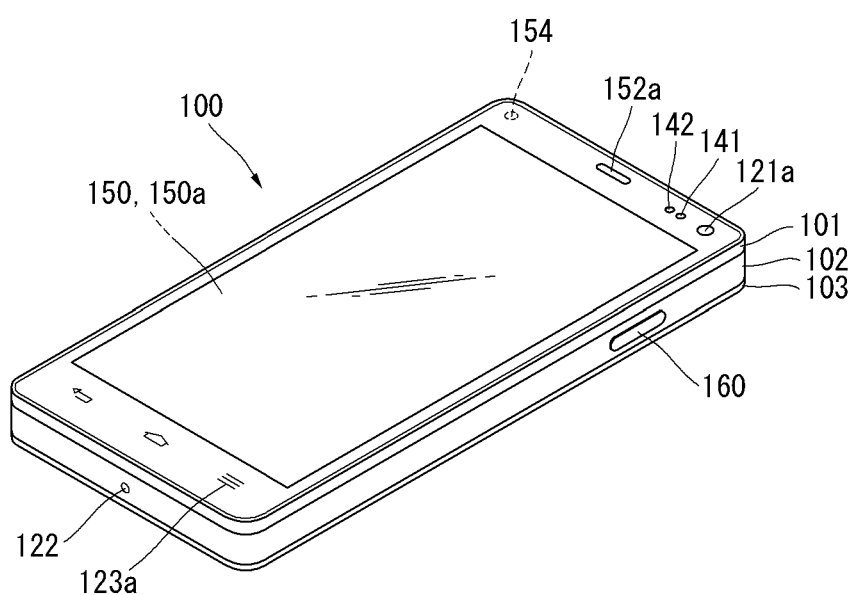
FIGS. 1 and 2 are perspective views of an example of a mobile terminal according to an embodiment of the present invention, which have been seen in different directions.
Figure 2:
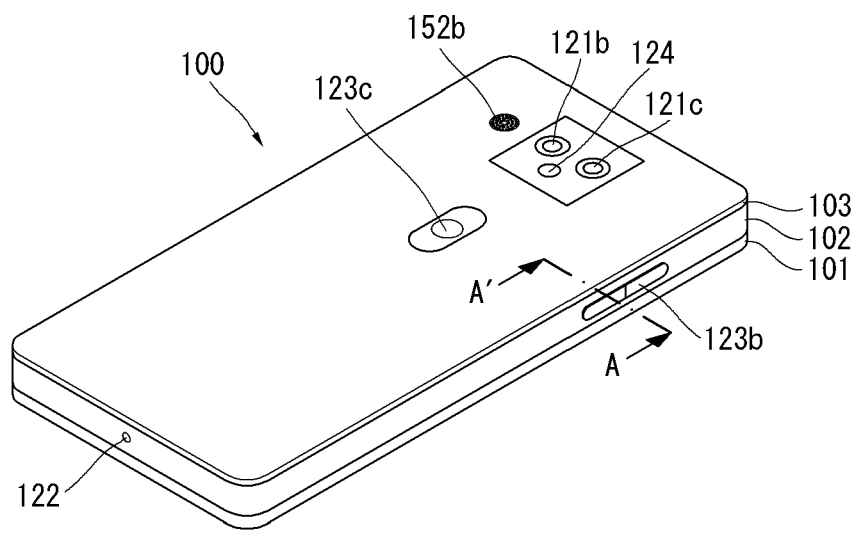
Figure 3:
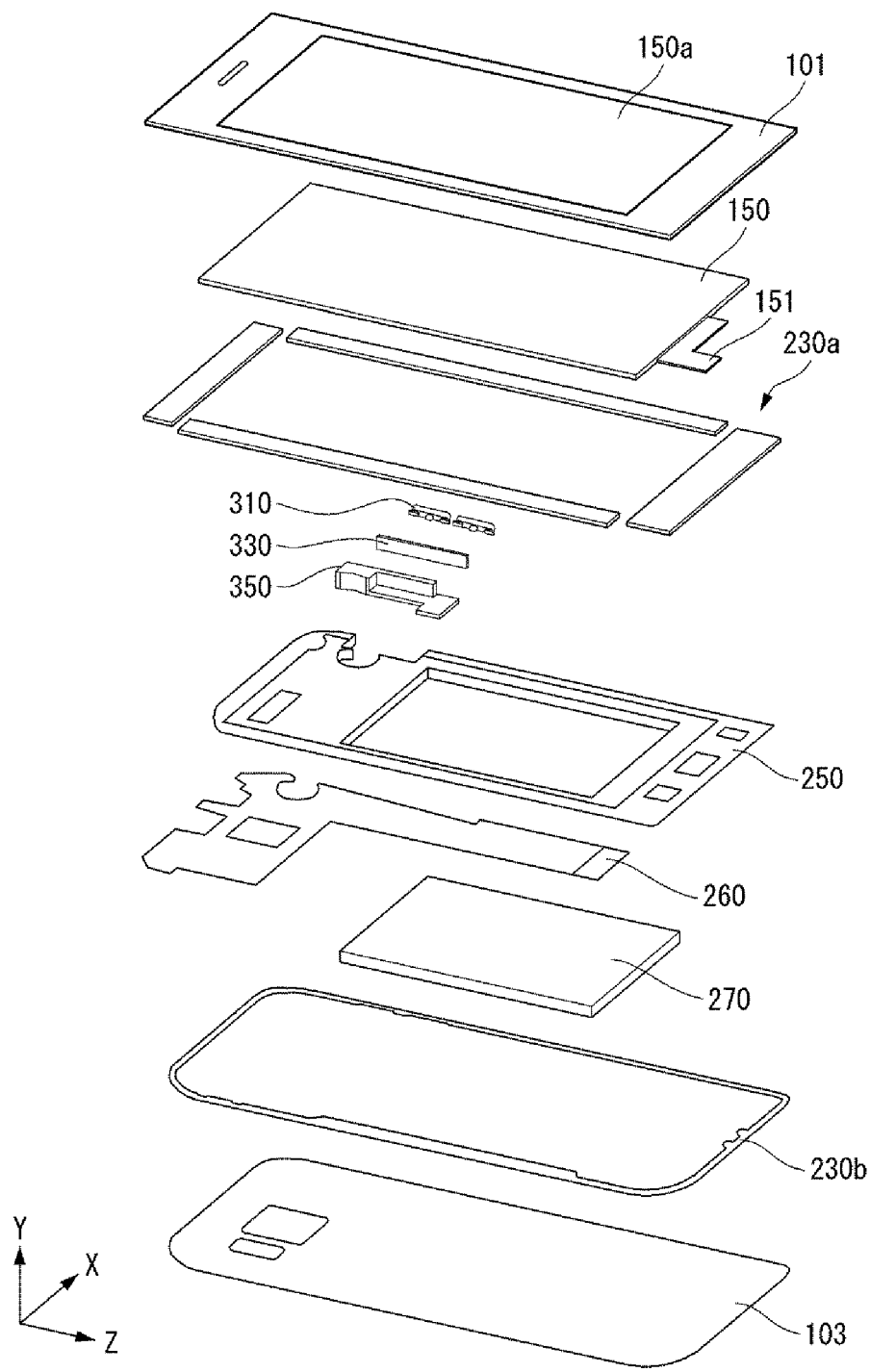
FIG. 3 is an exploded perspective view showing the internal elements of the mobile terminal shown in FIGS. 1 and 2.

FIGS. 1 and 2 are diagrams showing an external appearance of a mobile terminal according to an embodiment of the present invention at various angles. FIG. 3 is an exploded perspective view showing the internal elements of the mobile terminal shown in FIGS. 1 and 2.

Referring to FIGS. 1 and 2, the mobile terminal 100 is described with reference to a bar-type terminal body. However, the mobile terminal 100 may alternatively be implemented in any of a variety of different configurations. Examples of such configurations include watch type, clip type, glasses type, or as a folder type, flip type, slide type, swing type, and swivel type in which two and more bodies are combined with each other in a relatively movable manner, and combinations thereof. Discussion herein will often relate to a particular type of mobile terminal (e.g., a bar type, watch type or glasses type). However, such teachings with regard to a particular type of mobile terminal will generally apply to other types of mobile terminals as well.

Referring to FIGS. 1 to 3, the terminal body of the mobile terminal includes a case member that defines an internal space. The case member may include a front case 101, a rear case 102, and a rear cover 103 that define the internal space of the terminal body. The front of the terminal body is covered with the front case 101, and the rear of the terminal body is covered with the rear cover 103. The rear case 102 forms the side of the terminal body.

The internal space of the terminal body is formed by the coupling of the front case 101, the rear case 102, and the rear cover 103. Various electronic parts are disposed in the internal space of the terminal body.

A middle cover 250 may be positioned between the front case 101 and the rear cover 103 as shown in FIG. 3. The rear case 102 may be bonded to the side of the middle cover 250 or may be integrated with the middle cover 250.

The display unit may be positioned on the front of the terminal body to output information. A display unit 150, 150a includes a display panel 150 in which a pixel array has been formed and a window 150a that covers the display panel 150. The window 150a may be mounted on the front case 101 to form the front of the mobile terminal along with the front case 101.

Various electronic parts may be mounted on the middle cover 250. Electronic parts that may be mounted on the middle cover 250 include a battery pack 270, a main circuit board 260, an identity module and a memory card. More specifically, key modules 310, 330, and 350 according to an embodiment of the present invention can be mounted on the sides of the rear case 102 and the middle cover 250. The key modules 310, 330, and 350 may include a side key exposed on the side of the terminal body.

The rear cover 103 for covering electronic parts mounted on the middle cover 250 may be coupled. If the battery pack 270 is a replaceable model, the rear cover 103 is detachably coupled to the middle cover 250. When the rear cover 103 is separated from the middle cover 250, electronic parts mounted on the middle cover 250 are exposed to the outside.

The rear case 102 may be coupled to the side of the middle cover 250. The side key may be exposed on the side of the rear case 102 through holes that penetrate the side of the middle cover 250 and the sidewall of the rear case 102. An opening part through which a camera 121b or an audio output module 152b is exposed to the outside can be provided in the rear cover 103. The cases 101, 102, 103 may be formed by injection-molding synthetic resin or may be formed of metal, such as stainless steel (STS), aluminum (Al) or titanium (Ti).

The mobile terminal according to an embodiment of the present invention is not limited to the configuration in which the plurality of case members 101, 102, and 103 forms the internal space in which various electronic parts are received, as shown in FIGS. 1 to 3. For example, a single case can be configured to provide the internal space. In this instance, the terminal body of a uni-body in which synthetic resin or metal extended from the side to the rear may be implemented.

The mobile terminal can be implemented to have a waterproof function for preventing water from permeating the inside of the terminal body. Thus, a waterproof unit may have at least one seal member 230a positioned between the front case 101 and the middle cover 250. Furthermore, at least one seal member 230b may be positioned between the middle cover 250 and the rear cover 103. A waterproof design is applied to the key modules 310, 330, and 350 mounted on the middle cover 250. The waterproof structure of the key modules 310, 330, and 350 is described in detail later. The seal members 230a and 230b may be implemented using a waterproof tape.

In addition, the mobile terminal includes a display unit 150, first and second audio output modules 151a and 151b, a proximity sensor 141, an illumination sensor 142, an optical output module 154, first and second cameras 121a and 121b, first and second manipulation units 123a and 123b, a microphone 122, and the interface unit 160.

The mobile terminal may be described as shown in FIGS. 1 and 2. The display unit 150, the first audio output module 151a, the proximity sensor 141, the illumination sensor 142, the optical output module 154, the first camera 121a, and the first manipulation unit 123a are disposed on the front of the terminal body. The second manipulation unit 123b, the microphone 122, and the interface unit 160 are disposed on the side of the terminal body. The second audio output module 151b and the second camera 121b are disposed on the rear of the terminal body.

These elements are not limited to such positions. The elements may be excluded or substituted, if necessary, or may be positioned on different surfaces. For example, the front of the terminal body may not include the first manipulation unit 123a, and the second audio output module 152b may be provided on the side of the terminal body not the rear of the terminal body.

A display panel driving unit is connected to the main circuit board 260 through a flexible circuit board 151, such as a flexible printed circuit (FPC), and is connected to the wires of the pixel array. The display panel driving unit displays (or outputs) image information on a screen of the display panel 150 by writing information processed by the mobile terminal in the pixel array of the display panel 150. For example, execution screen information of an application program driven in the mobile terminal or user interface (UI) or graphic user interface (GUI) information based on such execution screen information may be displayed on a screen of the display panel 150.

The display unit 150 outputs information processed in the mobile terminal 100. The display unit 150 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof. In a liquid crystal display, there is a need for a backlight unit (BLU) that radiates light to the display panel 150. In FIG. 3, the backlight unit is omitted.

The display unit 150 may be implemented using two display devices implementing the same or different display technology. For instance, a plurality of the display units 150 may be arranged on one side, either spaced apart from each other, or these devices may be integrated, or these devices may be arranged on different surfaces.

The display unit 150 may also include a touch sensor which senses a touch input received at the display unit. When a touch is input to the display unit 150, the touch sensor can be configured to sense this touch and the controller 180, for example, can generate a control command or other signal corresponding to the touch. The content which is input in the touching manner may be a text or numerical value, or a menu item which may be indicated or designated in various modes.

The touch sensor may be configured in a form of a film having a touch pattern, disposed between the window 150a and a display on a rear surface of the window 150a, or a metal wire which is patterned directly on the rear surface of the window 150a. Alternatively, the touch sensor may be integrally formed with the display. For example, the touch sensor may be disposed on a substrate of the display or within the display.

The display unit 150 may also form a touch screen together with the touch sensor. Here, the touch screen may serve as the user input unit 123. Therefore, the touch screen can replace at least some of the functions of the first manipulation unit 123a. In addition, the first audio output module 152a may be implemented in the form of a speaker to output voice audio, alarm sounds, multimedia audio reproduction, and the like.

The window 150a of the display unit 150 will typically include an aperture to permit audio generated by the first audio output module 152a to pass. One alternative is to allow audio to be released along an assembly gap between the structural bodies (e.g., a gap between the window 150a and the front case 101). In this instance, a hole independently formed to output audio sounds may not be seen or is otherwise hidden in terms of appearance, thereby further simplifying the appearance and manufacturing of the mobile terminal 100.

Further, the optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 150 or stored in the memory 170.

The first, second and third manipulation units 123a, 123b and 123c are examples of the user input unit 123, which may be manipulated by a user to provide input to the mobile terminal 100. The first, second and third manipulation units 123a, 123b and 123c may also be commonly referred to as a manipulating portion, and can employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

The third manipulation unit 123c may be positioned on the rear of the terminal body, and may include a fingerprint recognition sensor to obtain a user's fingerprint. The third manipulation unit 123c can also provide obtained fingerprint information to the controller so that the fingerprint information is used for user authentication.

FIG. 2 illustrates the third manipulation unit 123c, that is, a touch key, but possible alternatives thereof include a mechanical key, a push key, a touch key, and combinations thereof. Input to the first and second manipulation units 123a and 123b may be used in various ways. For example, the first manipulation unit 123a may be used for a user to provide an input to a menu, home key, cancel or search, and the second manipulation unit 123b may be used for a user to provide an input that controls a volume level output from the first or second audio output module 152a or 152b or that switch to a touch recognition mode of the display unit 150.

In addition, the second audio output module 152b may be implemented as the key modules 310, 330, and 350 to which the waterproof design has been applied. The rear input unit may be located to overlap the display unit 150 of the front side in a thickness direction of the terminal body. As one example, the rear input unit may be located on an upper end portion of the rear side of the terminal body such that a user may easily manipulate it using a forefinger when the user grabs the terminal body with one hand. Alternatively, the rear input unit may be positioned at most any location of the rear side of the terminal body.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 150 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 serves as a path allowing the mobile terminal 100 to interface with external devices. For example, the interface unit 160 may include one or more of a connection terminal for connecting to another device (e.g., an earphone, an external speaker, or the like), a port for near field communication (e.g., an infrared data association (IrDA) port, a Bluetooth port or a wireless LAN port), or a power supply terminal for supplying power to the mobile terminal 100. The interface unit 160 may be implemented in the form of a socket for accommodating an external card, such as a subscriber identification module (SIM), a user identity module (UIM) or a memory card for information storage.

For example, as shown in FIG. 1, the interface unit 160 may include a SIM tray and an input/output port. A SIM card may be loaded onto the SIM tray. The SIM tray can be moved to the inside and outside of mobile terminal for the replacement and/or exchange of the SIM card. The input/output port can also be the passage of power provided in the mobile terminal. The input/output port may be connected to the mobile terminal and an external terminal or an external electronic device, thus becoming an input/output path for information and an electrical signal.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

A flash 124 is shown adjacent to the second camera 121b. When an image of a subject is captured with the camera 121b, the flash 124 illuminates the subject. The second audio output module 152b may be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or the main circuit board 260 formed by the case. For example, an antenna which configures a part of the broadcast receiving module may be retractable into the terminal body. Alternatively, an antenna may be formed using a film attached to an inner surface of the rear cover 103, or a case that includes a conductive material.

An antenna may be connected to a broadcasting reception module mounted on the main circuit board 260. The antenna may be configured to be drawn out from the terminal body. Alternatively, the antenna may be configured in a film type and attached to the inside of the rear cover 103. A case including a conductive material may be configured to function as the antenna.

A power supply unit for supplying power to the mobile terminal 100 may include a battery pack 270 mounted on the terminal body or detachably coupled to the outside of the terminal body. The battery pack 270 may receive power via a power source cable connected to the interface unit 160. Also, the battery pack 270 may be recharged in a wireless manner using a wireless charger. Wireless charging may be implemented by magnetic induction or electromagnetic resonance.

The terminal body is equipped with the power supply unit for supplying power to the mobile terminal. The power supply unit may include a battery pack embedded in the terminal body or may include a battery pack detachably configured in the outside of the terminal body.

The battery pack 270 is connected to the main circuit board 260 to generate DC power necessary for the driving of the mobile terminal. The battery pack 270 may be configured to be supplied with power through a power cable connected to the interface unit 160. The battery pack 270 may be configured to be wirelessly charged through a wireless charging device. The wireless charging may be implemented using a magnetic induction method or a resonant method (or magnetic resonant method).

An accessory for protecting an appearance or assisting or extending the functions of the mobile terminal 100 may also be provided on the mobile terminal 100. As one example of the accessory, a cover or pouch for covering or accommodating at least one surface of the mobile terminal 100 may be provided. The cover or pouch may cooperate with the display unit 150 to extend the function of the mobile terminal 100. Another example of the accessory is a touch pen for assisting or extending a touch input to a touch screen.

Figure 4:
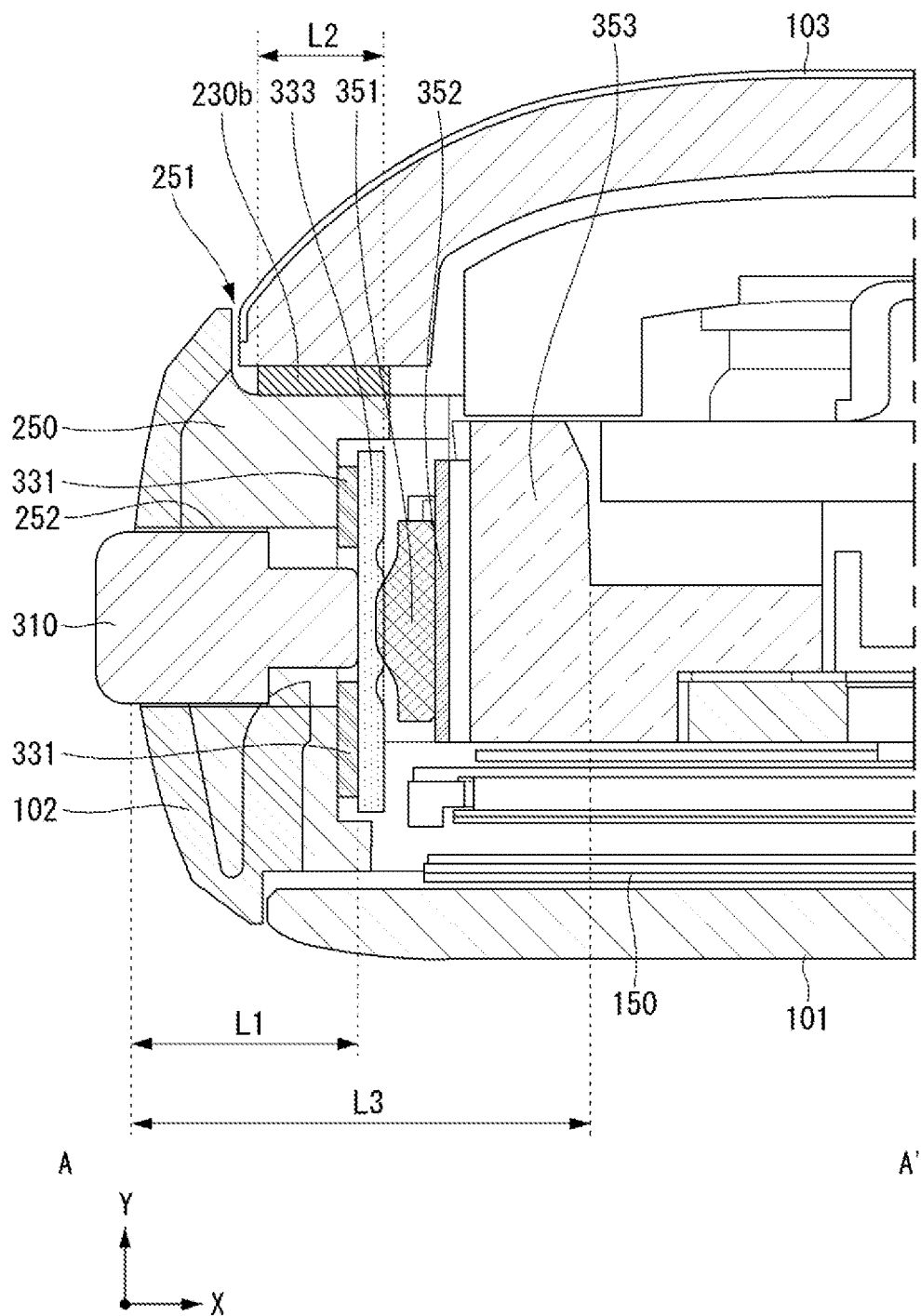
FIG. 4 is a cross-sectional view showing a key module and a sectional structure around the key module, which has been taken along line A-A' in FIG. 2.
Figure 5A:
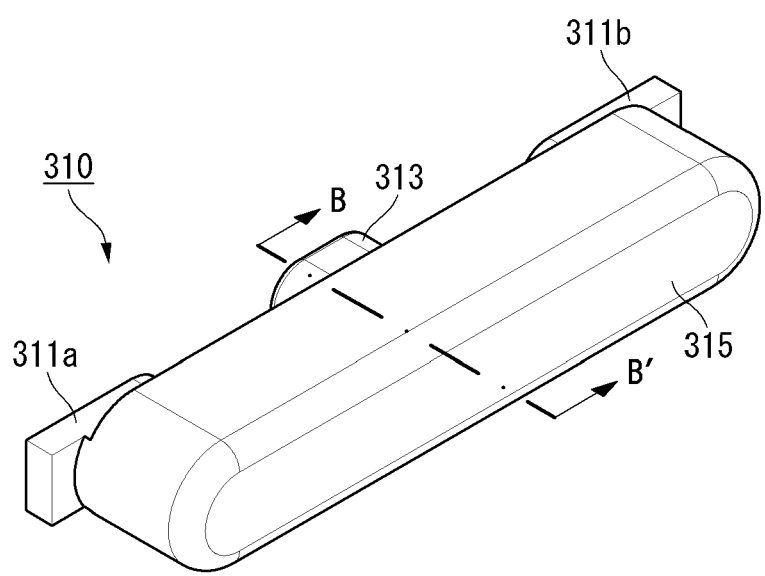
FIGS. 5A and 5B are detailed diagrams of the structure of a key.
Figure 5B:
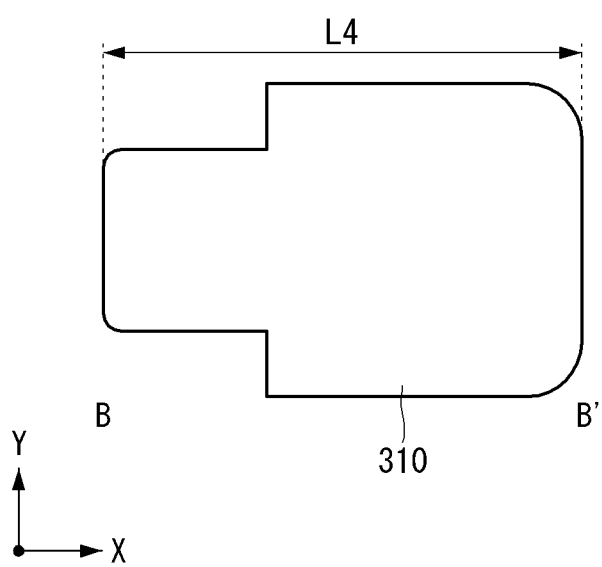
Figure 6:
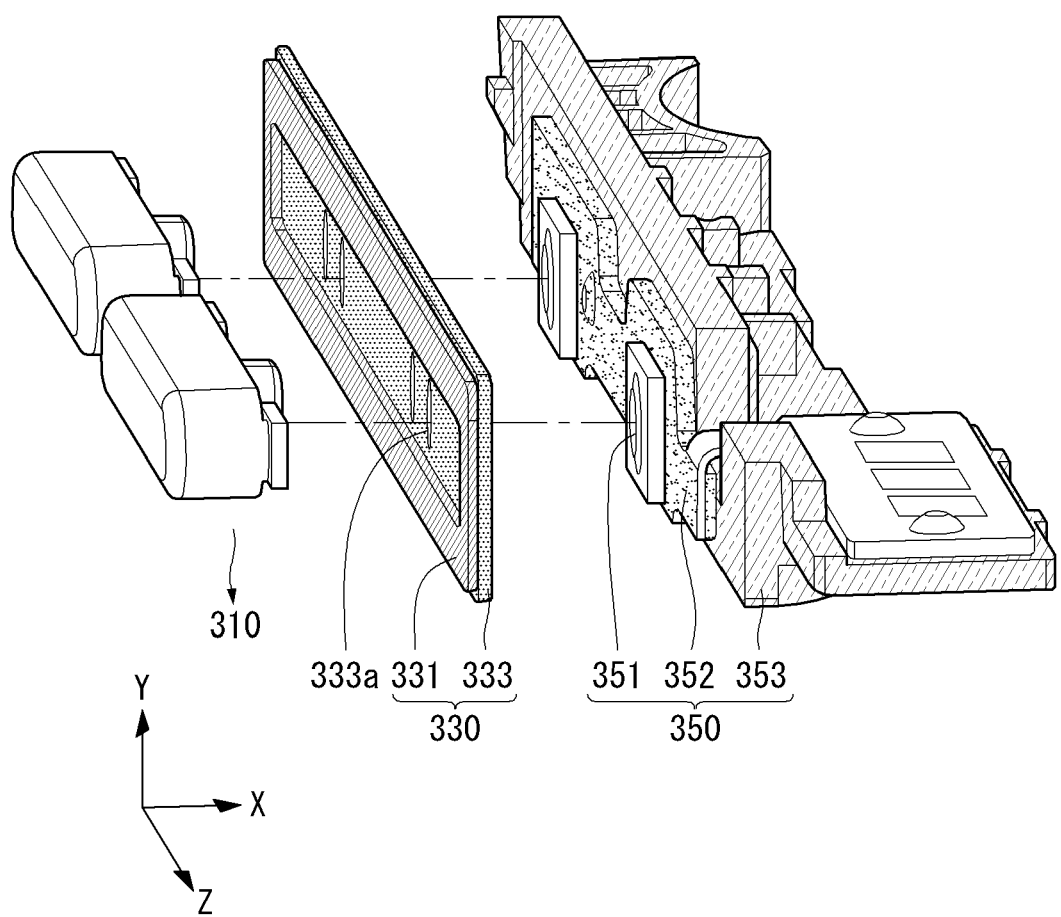
FIG. 6 is an exploded perspective view showing the elements of the key module.

Next, FIG. 4 is a cross-sectional view showing a key module and a sectional structure around the key module, which has been taken along line A-A' in FIG. 2, FIG. 5A is a detailed perspective view of the structure of the key, FIG. 5B is a cross-sectional view of the key taken along line B-B' in FIG. 5A, and FIG. 6 is an exploded perspective view showing the elements of the key module.

Referring to FIGS. 4 to 6, a key module 310, 330, 350 includes a key 310, a waterproof member 330, and a circuit support 350. The key 310 is implemented as one piece of the same material. The key 310 is moved toward the internal space of the terminal body by pressure generated due to an external force applied by a user. Further, the circuit support 350 includes a dome terminal 351 generating a key signal while operating in conjunction with the pressure of the key 310. The waterproof member 330 is positioned between the key 310 and the circuit support 350 to deliver the pressure of the key 310 to the dome terminal 351.

As shown in FIGS. 5A and 5B, the key 310 includes a key head 315, and a neck part 313 and flanges 311a and 311b formed on the rear of the key head 315. The key head 315, the neck part 313, and the flanges 311a and 311b correspond to a single part integrated using the same material. The key head 315, the neck part 313, and the flanges 311a and 311b may be fabricated using single metal, for example, aluminum (Al).

The structure of the key head 315 may be described on three XYZ axes. The front part of the key head 315 is exposed to the outside of the terminal body through holes 252 that penetrate the sidewall of the rear case 102 and the middle cover 250. The key head 315 has a structure that is long in a length direction (i.e., Z-axis direction) and that is relatively short in a thickness direction (i.e., X-axis direction) and a width direction (i.e., Y-axis direction). The neck part 313 protrudes in the thickness direction of the key head 315 with respect to the central part of the rear of the key head 315, and faces the waterproof member 330.

The flanges 311a and 311b include the first flange 311a positioned at an edge on one side of the rear of the key head 315 and the second flange 311b positioned at an edge on the other side of the rear of the key head 315. The first flange 311a is spaced apart from the second flange 311b with the neck part 313 interposed therebetween. The first and the second flanges 311a and 311b protrude to the outside of the key head 315 with respect to the length direction Z of the key head 315, and thus face sidewall guides 253 (FIGS. 10A and 10B), respectively, near the holes of the middle cover 250. The flanges 311a and 311b and the sidewall guides 253 of the middle cover 250 are brought into contact with each other.

As shown in FIG. 6, the waterproof member 330 includes a rubber plate 333 and a waterproof tape 331. The rubber plate 333 faces the neck part 313 of the key 310. The rubber plate 333 is made of a synthetic rubber or natural rubber material, and blocks the penetration of moisture toward the circuit support 350. The rubber plate 333 delivers the pressure of the key 310 to which an external force is applied to the circuit support 350, and pushes the key 310 by an elastic restoring force when the key 310 is pressed so that the key returns to its original position. The rubber plate 333 includes a plurality of slits 333a disposed near a portion that faces the neck part 311 of the key 310. The waterproof tape 331 is bonded to an edge on the front of the rubber plate 333 that faces the neck part 313 of the key 310, thus blocking the penetration of moisture toward the slits 331a and the circuit support 350.

The circuit support 350 includes a circuit board 352 on which the dome terminal 351 is mounted and a bracket 353 to which the circuit board 352 is bonded. The dome terminal 352 is pressed by the pressure of the key 310 applied through the rubber plate 333. When the dome terminal 351 is pressed by the pressure of the key 310, a key signal is generated from the circuit board 352. The circuit board 352 may be implemented using a flexible circuit board, such as a flexible printed circuit (FPC).

In addition, the circuit board 352 is connected to the main circuit board 260 and transmits the key signal to the main circuit board 260 through the dome terminal 351. The controller on the main circuit board 26 can adjust the volume in response to the key signal or execute a user command. The bracket 353 is fixed on the middle cover 250 and supports the circuit board 352 so that the dome terminal 351 faces the rubber plate 333.

In FIGS. 4 to 5B, L1 is the length from the end on the side of the terminal body to the rubber plate 333. L2 is the length of a seal member, that is, the rear waterproof tape 230b configured to prevent the penetration of moisture through a gap 251 between the rear cover 103 and the middle cover 250. L3 is the length of the side of the terminal body and the sidewall of the bracket 353. L4 is the length of the key 310 in the thickness direction. In one embodiment, L1=2.61 mm, L2=1.31 mm, L3=4.57 mm, and L4=2.61 mm, but the present invention is not limited to such design values because the design values may be different depending on a structure of the mobile terminal.

In this instance, in accordance with one embodiment of the present invention, L1, that is, the length from the end on the side of the terminal body to the rubber plate 333, may be 2.61 mm. As shown in FIG. 4, the length L1 does not overlap the area of the rear end of the display 150. That is, in a conventional side key structure having a waterproof structure, the side key module occupies a significant portion of the area at the rear end of the display, thereby inevitably reducing a substantial PCB mounting area. In accordance with one embodiment of the present invention, however, the length up to the key 310 and the waterproof member 330 in the side key module is relatively short. Accordingly, the side key of the waterproof structure is positioned in the space of a bezel area size, and the remaining space, that is, the area at the rear end of the display, can be used as the space in which electronic parts are mounted.

Figure 7A:
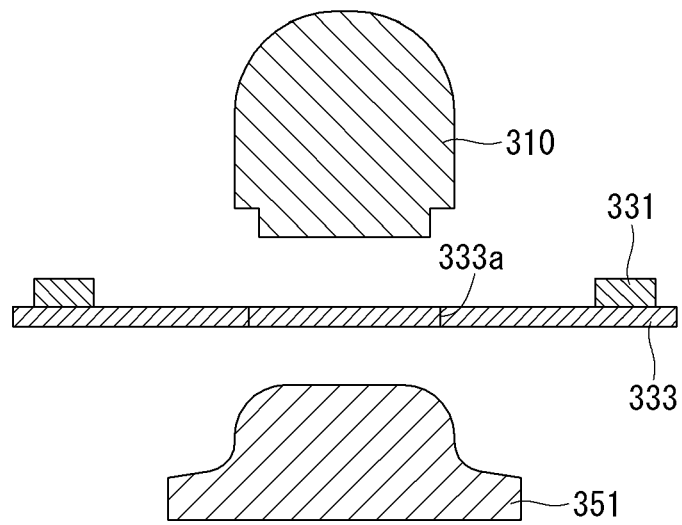
FIGS. 7A and 7B are diagrams showing an operation of the key module.
Figure 7B:
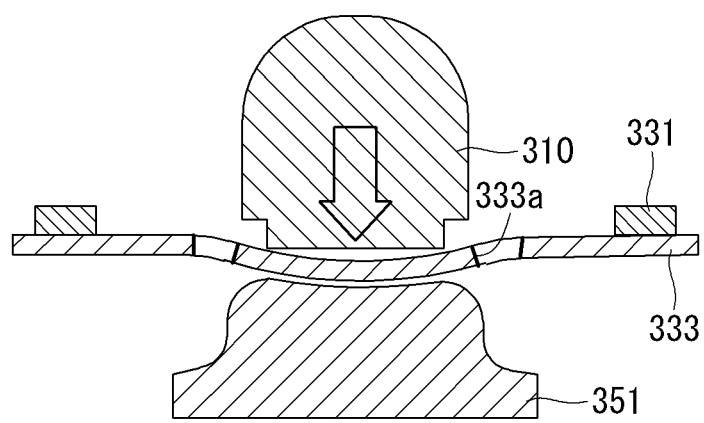

When a user presses the key 310, the neck part 313 of the key 310 presses the rubber plate 333 and the dome terminal 351. When the key 310 is not pressed as shown in FIG. 7A, the penetration of moisture is blocked because the slits 333a of the rubber plate 333 are closed. When the key 310 is pressed as shown in FIG. 7B, the rubber plate 333 and the dome terminal 351 are pressed by the pressure of the key 310. Accordingly, the gap between the slits 333a is widened, thereby reducing resistance of the rubber plate 333 against the pressure of the key 310.

Figure 8:
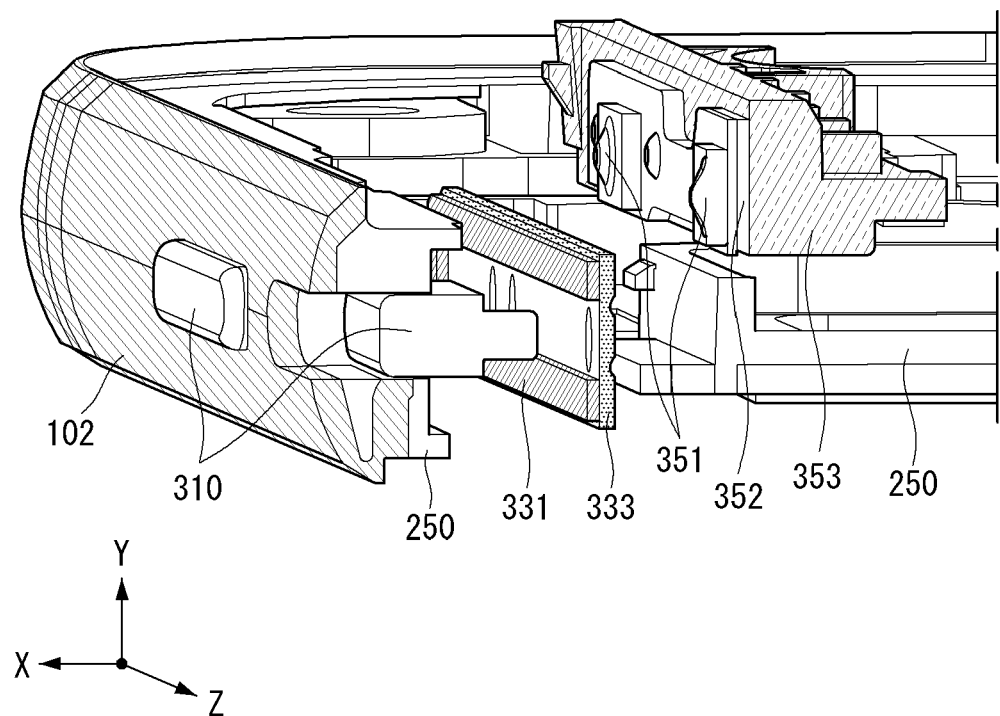
FIG. 8 is a perspective view showing a key module assembly method in the internal space of a terminal body.
Figure 9:
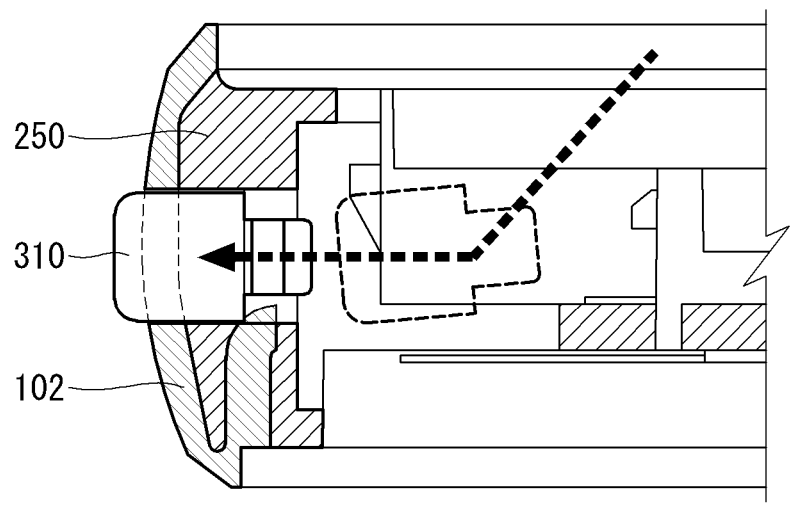
FIG. 9 is a cross-sectional view showing a key assembly method.

The key modules 310, 330, and 350 are assembled with the middle cover 250 in the internal space of the terminal. More specifically, as shown in FIGS. 8 and 9, the key 310 is inserted into the holes 252 of the middle cover 250 in the assembly direction from the internal space of the terminal body toward the outside of the terminal body, and is then assembled with the terminal body. Due to such an assembly method, the key 310 can be fabricated as one piece of a single material, and a moisture penetration path through the key 310 can be minimized. When the key 310 is assembled with the middle cover 250 from the outside of the terminal body to the internal space of the terminal body, an external scratch problem may occur in the terminal body. In order to prevent this problem, the key 310 is fabricated to have a stack structure of metal and rubber and a moisture penetration path is increased.

The assembly sequence of the key modules 310, 330, and 350 is described in more detail below. As shown in FIG. 9, the key 310 is inserted into the holes 252 of the middle cover 250 within the terminal body in an arrow direction. Thereafter, the waterproof member 330 is assembled in the arrow direction to face the neck part 313 of the key 310. Furthermore, the circuit support 350 is inserted in the arrow direction and coupled to the waterproof member, so the key modules 310, 330, and 350 can be finally assembled with the mobile terminal.

In general, the side key is inserted from the outside to the inside through the holes positioned between the front case and the rear case in the state in which the front case and rear case of the mobile terminal have been assembled. In contrast, the arrow direction of FIG. 9 means a direction opposite the direction in which the side key is inserted from the outside to the inside. That is, in accordance with one embodiment of the present invention, before the front case and the rear case are coupled, the key modules 310, 330, and 350 are mounted and the rear case is coupled, so the side key can be assembled in a structure coupled to the mobile terminal. Furthermore, for example, in the state in which the front case and the rear case have been partially assembled, the key 310, the waterproof member 330, and the circuit support 350 may be sequentially connected and assembled within the mobile terminal body.

A process for the key 310 to be assembled in the direction of the holes 252 of the middle cover 250 within the internal space of the mobile terminal body is described in more detail below. In particular, FIGS. 10A and 10B are perspective views showing the assembly direction of the key in the internal space of the terminal body.

Figure 10A:
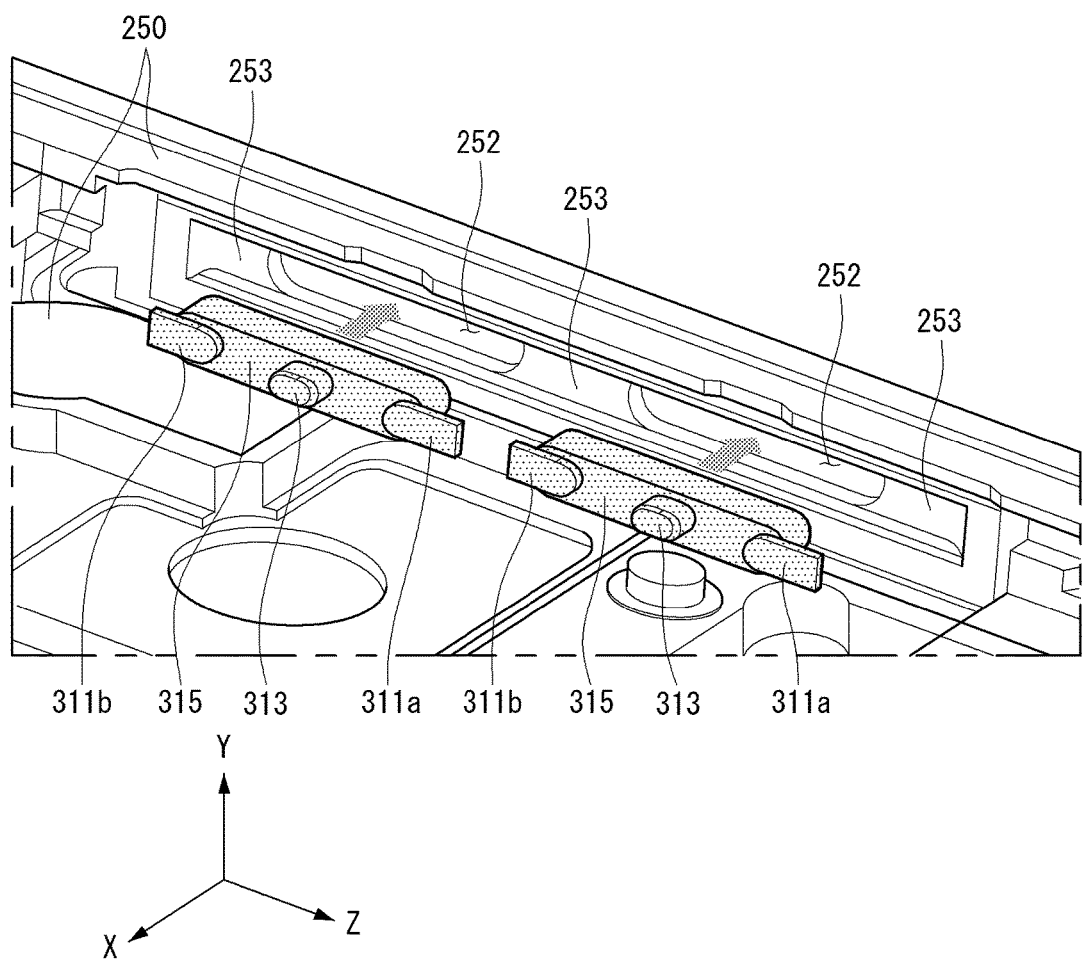
FIGS. 10A and 10B are perspective views showing the assembly direction of the key in the internal space of the terminal body.
Figure 10B:
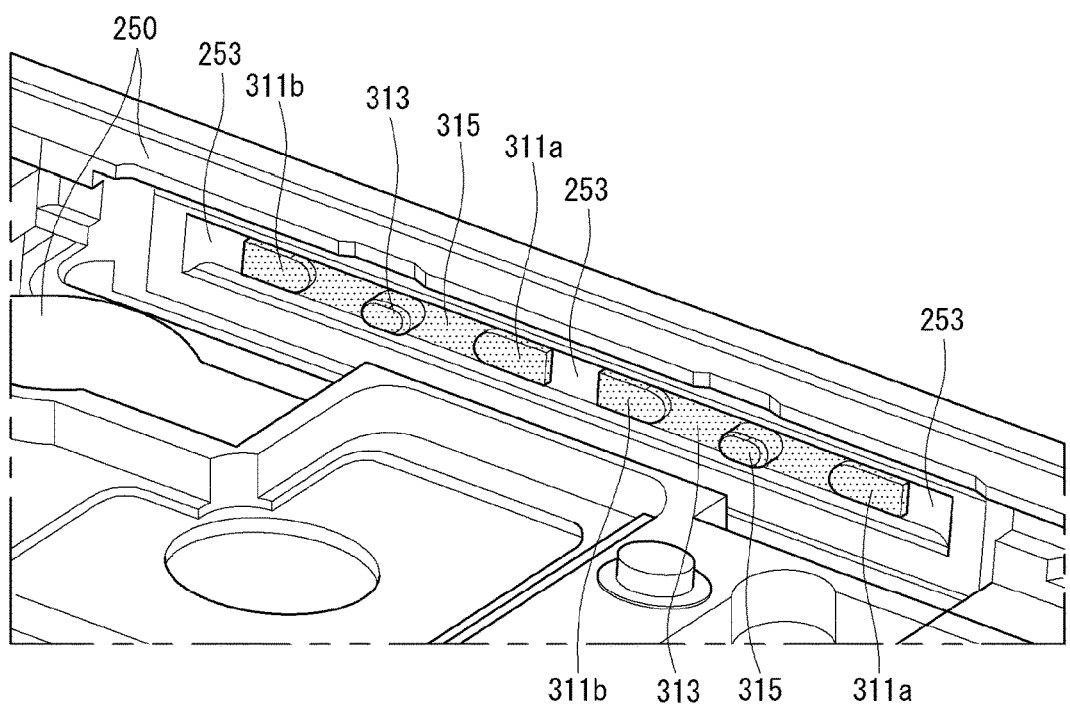

As shown in FIGS. 10A and 10B, the key 310 is inserted into the holes 252 of the middle cover 250 in the arrow direction from the internal space of the terminal body toward the outside of the side of the terminal body. When the key 310 is assembled with the middle cover 250 as described above, the flanges 311a and 311b on both sides of the key 310 face the guides 253 on the side of the middle cover 250. When the key 310 is inserted into the holes 252 on the side of the middle cover 250, the flanges 311a and 311b of the key 310 comes into contact with the guides 253 on the side of the middle cover 250.

Figure 11:
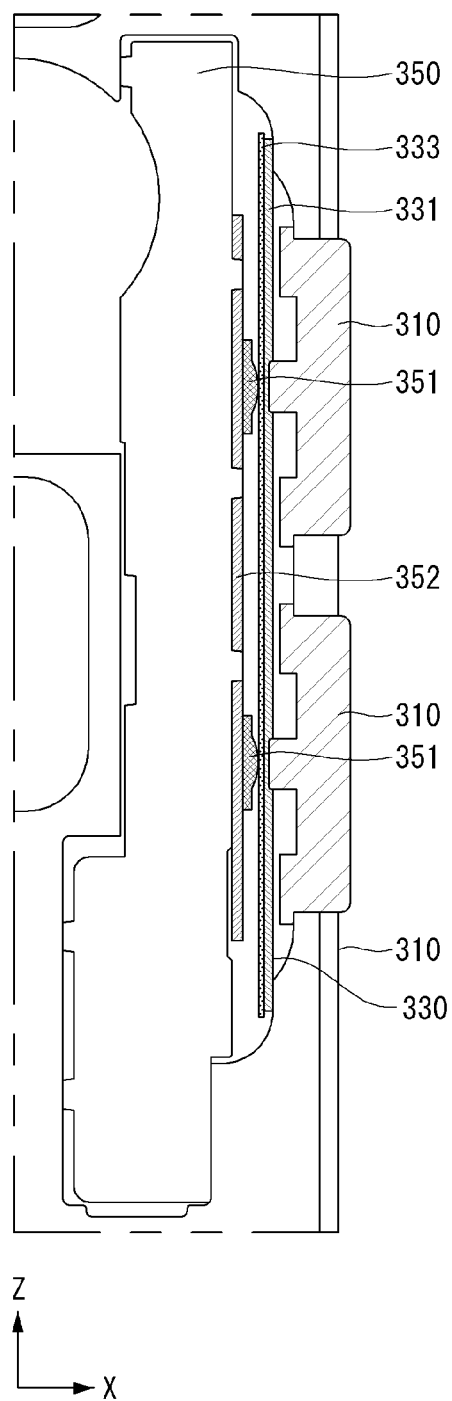
FIGS. 11 to 13 are diagrams showing the cross-sectional structure of the terminal body in the state in which the key modules have been assembled with a middle cover.
Figure 12:
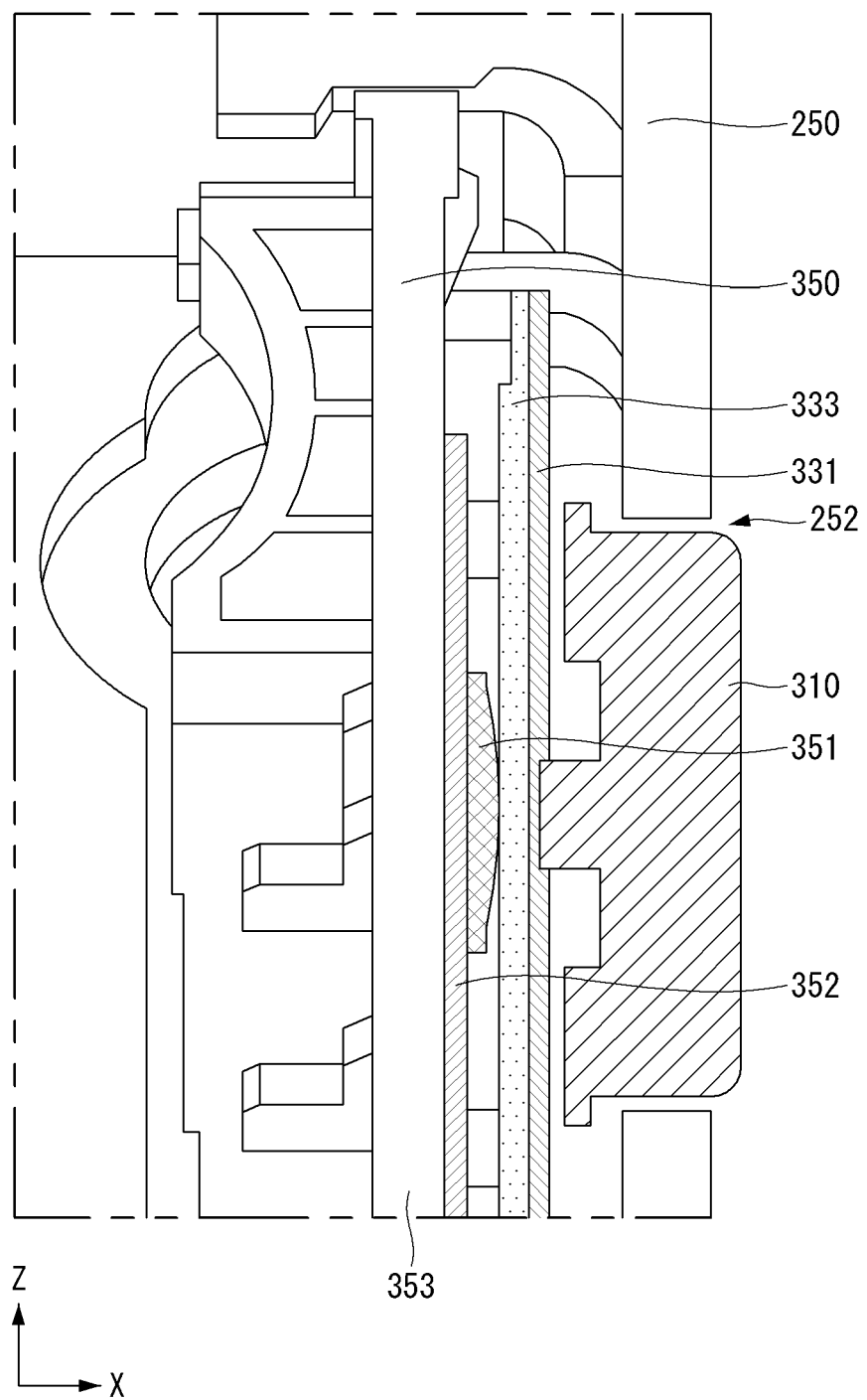
Figure 13:
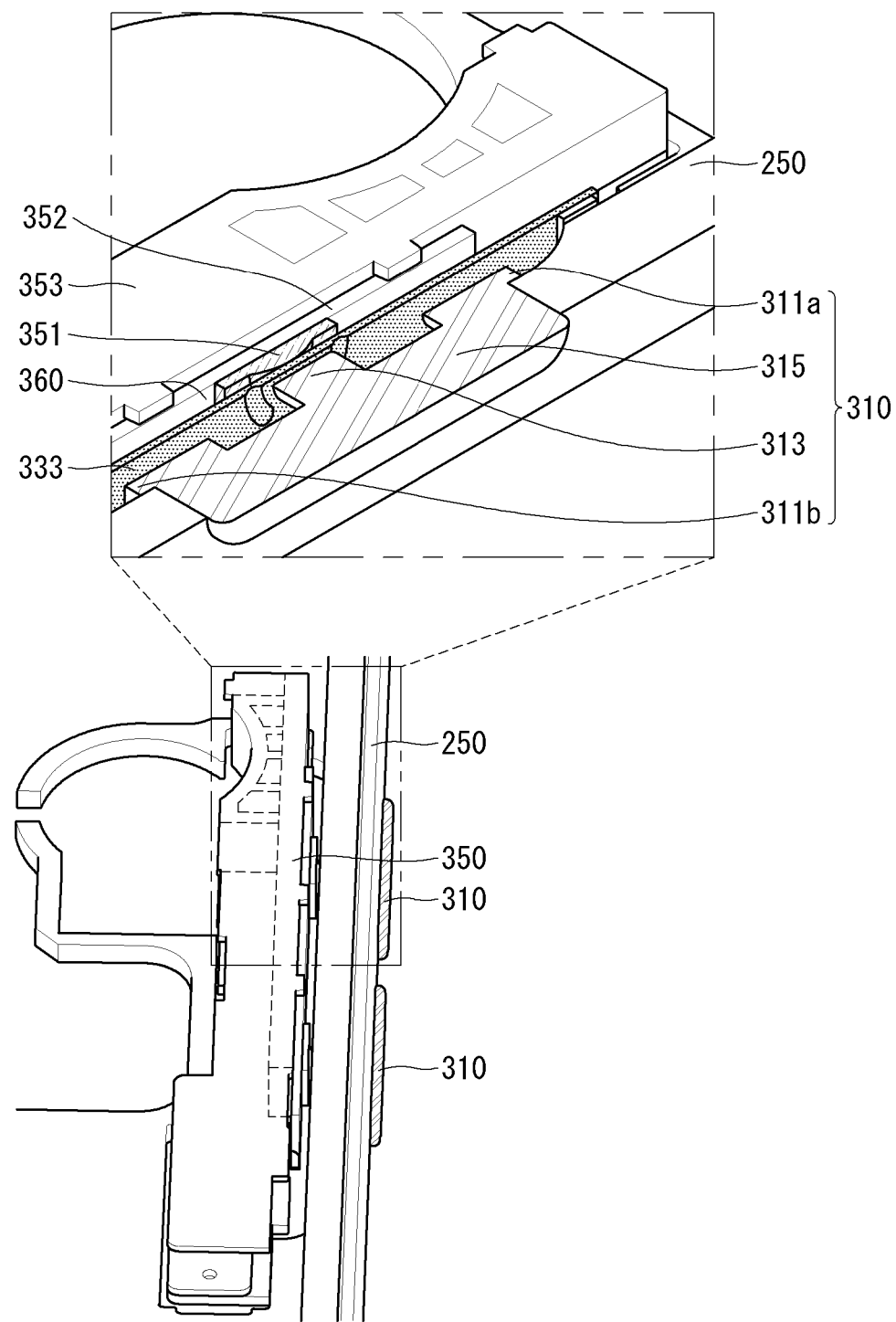

FIGS. 11 to 13 are diagrams showing the cross-sectional structure of the terminal body in the state in which the key modules 310, 330, and 350 have been assembled with the middle cover 250. Since the flanges 311a and 311b are fixed to the middle cover 250 in the length direction Z of the key 310, the thickness of the terminal body can be made slim and the moisture penetration path in the width direction Y can be minimized in the portion into which the key 310 is inserted. When the flanges of the key 310 are positioned in the width direction Y, the terminal body becomes thick due to the flanges and the moisture penetration path is formed along the holes in the width direction into which the flanges are inserted.

The key modules 310, 330, and 350 and the middle cover 250 may be applied to mobile terminals of a waterproof model and a non-waterproof model in common. Accordingly, the embodiment of the present invention can implement the commonness of the key modules in the waterproof model and the non-waterproof model, thereby being capable of improving part compatibility.

Figure 14:
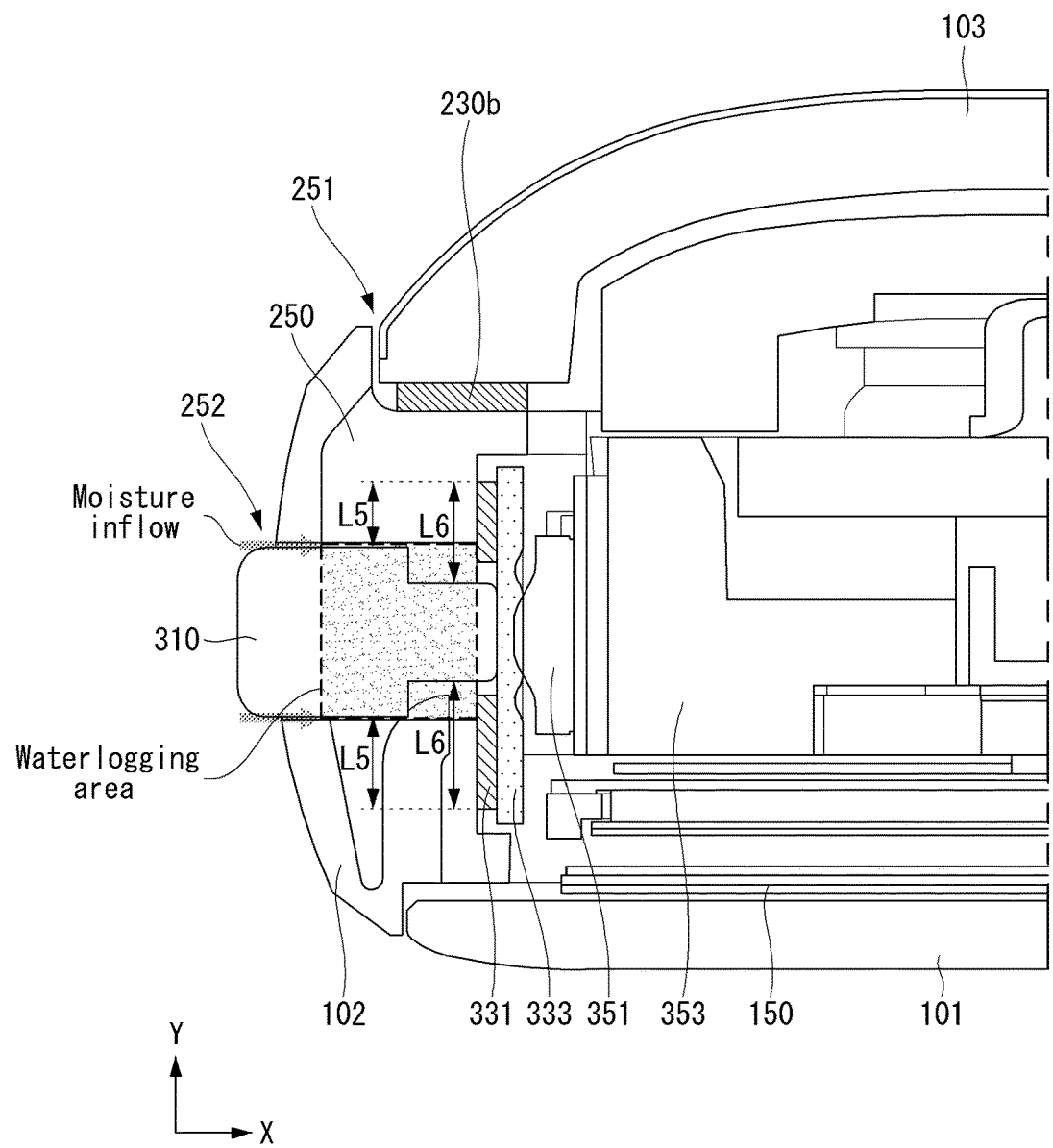
FIG. 14 is a cross-sectional view showing the moisture penetration path and waterlogging area of the key modules.

FIG. 14 is a cross-sectional view showing the moisture penetration path and waterlogging area of the key modules. Referring to FIG. 14, moisture within the mobile terminal on which the key modules have been mounted may enter the middle cover 250 through the moisture penetration path along the holes 252 into which the key modules have been inserted. The moisture penetration path is blocked by the waterproof tape 331 and rubber plate 333 of the waterproof member 330. Accordingly, the waterlogging area is limited to FIG. 14 in the holes into which the key modules of the mobile terminal have been inserted. In FIG. 14, the size of the waterlogging area may be limited by properly setting L5 and L6 that define the distance between the key 310 and the waterproof tape 331.

The key can be implemented in a simple structure having a single material using the assembly method of assembling the key modules in the internal space of the mobile terminal according to an embodiment of the present invention and inserting the key into the holes of the mobile terminal in the assembly direction from the internal space to the external space. Furthermore, the moisture penetration path of the key modules can be minimized by optimizing the assembly direction of the key and flange direction.

Any or others of the aforementioned embodiments of the present invention should not be understood to be exclusive or different. In any or others of the aforementioned embodiments of the present invention, the elements or functions may be interchangeably used or used in combination.

It is evident to those skilled in the art that the present invention may be materialized in other specific forms without departing from the spirit and essential characteristics of the present invention. Accordingly, the detailed description should not be construed as being limited, but should be considered to be illustrative from all aspects. The range of right of the present invention should be determined by reasonable analysis of the attached claims, and all changes within the equivalent scope of the present invention are included in the range of right of the present invention.

What is claimed is:

1. A key module for a mobile terminal, the key module comprising:
    a key having a neck part and a head key pressed to enter an input to the mobile terminal;
    a circuit support configured to support a circuit board having a dome terminal to be pressed when the key head is pressed for entering the input to the terminal; and
    a waterproof member positioned between the key and the circuit support and configured to block a moisture penetration path along a hole in a case member of the mobile terminal into which the key module is inserted, wherein the waterproof member includes:
    a rubber plate facing the neck part of the key, the rubber plate including one or more slits; and
    a waterproof tape bonded to a front edge of the rubber plate facing the neck part.

2. The key module of claim 1, wherein the key head has a length direction Z, a thickness direction X and a width direction Y, in which the length direction Z is longer than the thickness direction X and longer than the width direction Y,
    wherein the neck part is formed on a rear of the key head to face the waterproof member,
    wherein the key further includes first and second flanges positioned at edges on both sides on the rear of the key head,
    wherein the neck part is interposed between the first and second flanges,
    wherein the key head is exposed at the case member, and
    wherein the first and the second flanges protrude to an outside of the key head in a length direction of the key head and come into contact with a wall surface near the hole of the case member.

3. The key module of claim 1, wherein the key is implemented as one piece of an identical material.

4. The key module of claim 1, wherein the circuit support comprises a bracket to which the circuit board is bonded, and
    wherein the bracket is fixed to the case member.

5. The key module of claim 1, wherein the rubber plate delivers a pressure of the key being pressed to the dome terminal for entering the input to the mobile terminal.

6. The key module of claim 5, wherein the rubber plate pushes the key by an elastic restoring force when the key is pressed so that the key returns to its original position.

7. The key module of claim 1, wherein the rubber plate includes a plurality of slits disposed near a portion that faces the neck part of the key.

8. The key module of claim 7, wherein the waterproof tape is bonded to an edge on the front of the rubber plate that faces the neck part of the key, thus blocking the penetration of moisture toward the slits and the circuit support.

9. The key module of claim 1, wherein a waterlogging area of the moisture penetrating the path along the hole in the case member is limited by setting a first distance between the key head and an outer edge of the waterproof tape and a second distance between the neck part of the key and the outer edge of the waterproof tape.

10. The key module of claim 1, wherein the key head protrudes from the case member of the mobile terminal.

11. A mobile terminal, comprising:
   a terminal body from having a display unit, an internal space being provided in the terminal body; and
   a key module partially exposed through a hole penetrating a sidewall of the terminal body,
   wherein the key module comprises:
   a key having a neck part and a head key pressed to enter an input to the mobile terminal;
   a circuit support configured to support a circuit board having a dome terminal to be pressed when the key head is pressed for entering the input to the terminal; and
   a waterproof member positioned between the key and the circuit support and configured to block a moisture penetration path along the hole in the sidewall of the mobile terminal into which the key module is inserted,
   wherein the waterproof member includes:
   a rubber plate facing the neck part of the key, the rubber plate including one or more slits; and
   a waterproof tape bonded to a front edge of the rubber plate facing the neck part.

12. The mobile terminal of claim 11, wherein the key head has a length direction Z, a thickness direction X and a width direction Y, in which the length direction Z is longer than the thickness direction X and longer than the width direction Y,
   wherein the neck part is formed on a rear of the key head to face the waterproof member,
   wherein the key further includes first and second flanges positioned at edges on both sides on the rear of the key head,
   wherein the neck part is interposed between the first and second flanges,
   wherein the key head is exposed at the case member, and
   wherein the first and the second flanges protrude to an outside of the key head in a length direction of the key head and come into contact with a wall surface near the hole of the case member.

13. The mobile terminal of claim 11, wherein the rubber plate delivers a pressure of the key being pressed to the dome terminal for entering the input to the mobile terminal.

14. The mobile terminal of claim 13, wherein the rubber plate pushes the key by an elastic restoring force when the key is pressed so that the key returns to its original position.

15. The mobile terminal of claim 11, wherein the rubber plate includes a plurality of slits disposed near a portion that faces the neck part of the key.

16. The mobile terminal of claim 15, wherein the waterproof tape is bonded to an edge on the front of the rubber plate that faces the neck part of the key, thus blocking the penetration of moisture toward the slits and the circuit support.

17. The mobile terminal of claim 11, wherein a waterlogging area of the moisture penetrating the path along the hole in the case member is limited by setting a first distance between the key head and an outer edge of the waterproof tape and a second distance between the neck part of the key and the outer edge of the waterproof tape.

18. A method of assembling a key module into an internal space of a terminal body of a mobile terminal through a hole penetrating a sidewall of the terminal body, the method comprising:
   inserting a key of the key module in the hole from the internal space of the terminal body toward an outside of the terminal body, the key having a neck part and a head key pressed to enter an input to the mobile terminal;
   positioning a waterproof member against the key, the waterproof member configured to block a moisture penetration path along the hole in the terminal body of the mobile terminal into which the key module is inserted; and
   fixing a circuit support, having a circuit board with a dome terminal to be pressed when the key head is pressed for entering the input to the terminal, to the internal space of the terminal body such that the waterproof member is positioned between the key and the circuit support and blocks a moisture penetration path along the hole in the terminal body into which the key module is inserted,
   wherein the waterproof member includes:
   a rubber plate facing the neck part of the key, the rubber plate including one or more slits; and
   a waterproof tape bonded to a front edge of the rubber plate facing the neck part.

* * * * *